United States Patent [19]

Wardell et al.

[11] 4,301,411

[45] Nov. 17, 1981

[54] NMR TEST METHOD FOR DISPERSION OF SOLIDS IN ELASTOMER COMPOSITIONS

[75] Inventors: Gerald E. Wardell, Killaloe; Vincent J. McBrierty, Sutton, both of Ireland

[73] Assignee: The Provost, Fellows and Scholars of the College of the Holy and Undivided Trinity of Queen Elizabeth, Dublin, Ireland

[21] Appl. No.: 117,333

[22] Filed: Jan. 31, 1980

[30] Foreign Application Priority Data

Feb. 1, 1979 [IE] Ireland .................................. 192/79

[51] Int. Cl.$^3$ ............................................. G01N 27/00
[52] U.S. Cl. ..................................... 324/307; 324/308
[58] Field of Search ............... 324/300, 307, 308, 310, 324/312, 314

[56] References Cited

U.S. PATENT DOCUMENTS 3,284,700  11/1966  Kingston ............................. 324/308
3,525,036  8/1970  Bene ................................... 324/307

*Primary Examiner*—Michael J. Tokar
*Attorney, Agent, or Firm*—Sughrue, Mion, Zinn, Macpeak and Seas

[57] ABSTRACT

An NMR test method is provided for determining the homogeneity of dispersion of a filler substance such as carbon black in an elastomer composition such as a rubber, either on an arbitrary scale or by reference to a standard dispersion of optimum homogeneity which is given the value 1.0 on a linear scale. The method involves measuring the intensity of the short component and the total intensity of the proton free induction decay, of a sample of the dispersion deriving the ratio $P_t$ of said intensities, and optionally deriving a second similar ratio $P_s$ from the standard dispersion to permit a value $P_t/P_s$ on said linear scale to be derived.

7 Claims, No Drawings

NMR TEST METHOD FOR DISPERSION OF SOLIDS IN ELASTOMER COMPOSITIONS

This invention relates to quality control in the production of elastomer compositions, such as rubber, natural and synthetic. More particularly it relates to the control of the degree of dispersion of filler substances, such as carbon black, in elastomer compositions, non-vulcanized or vulcanized, by providing a method for measuring the same.

There are between 20 and 30 different particulate materials which are commonly used as fillers or additives in making rubber compositions. These include several grades of carbon black; trademarks of some rubber-grade carbon blacks are listed by M. L. Studebaker in Rubber Chem. and Technol. 30 1400 (1957).

A conventional sequence of operations in the production of rubber articles, such as vehicle tires, begins with the preparation, or selection from stock, of a masterbatch comprising, for example, 75% natural rubber, 20% high abrasive furnace carbon black, 1.96% oil, 2% zinc oxide, 1% stearic acid, 0.04% peptiser (proportions by weight). It is desirable to evaluate the degree of dispersion of the carbon black in the masterbatch to determine the suitability of that masterbatch for incorporation in a primary mix. The masterbatch, if unsatisfactory, can be replaced by making or selecting from stock another more acceptable, or can be reworked to improve the dispersion of the contained carbon black, or can be blended with aliquots from well-dispersed masterbatches.

Manufacture proceeds by mixing, say, 50 parts of the masterbatch, 30 parts of synthetic elastomer, say, butadiene rubber, 15 parts of carbon black, (e.g., intermediate superabrasive furnace carbon black) and 5 parts other conventional ingredients, such as oil, zinc oxide, stearic acid, antioxidant, antiozonant, resin and wax to yield a primary mix. (All parts and percentages herein are by weight). It is desirable to evaluate the degree of dispersion of the carbon black in the primary mix. The result, if unsatisfactory, can be improved by further mixing of the primary mix, and checked by re-evaluation of the degree of dispersion.

Manufacture continues with the preparation of a final mix which comprises, say, 95 parts primary mix and 5 parts vulcanizing agents, such as sulphur and an accelerator. This mix could be subjected, in its turn, to dispersion evaluation, but this is not always necessary since the degree of dispersion is unlikely to deteriorate during final mix preparation.

The final mix is then processed into a staple, for example rubber sheet, which staple can in turn be subjected to testing, as can the final product, such as a vehicle tire, made from the staple.

It will be seen that there are several stages in the production of a rubber article from its raw materials at each of which stages a determination of the degree of dispersion of the filler substance may be desirable. Quality control procedures based on the results of these determinations can have a decisive effect on the suitability of the finished product for its purpose.

Conventional methods of determining the degree of dispersion of filler substances in elastomer compositions include visual inspection of microtome sections of the cured compositions under the microscope, with standard counting procedures. These methods include that of Cabot, which has a percentage scale of dispersion of particulate material. The sample size is about $10^{-4}$ g which is undesirably low, having regard to the known prevalence of macroscopic inhomogeneity within factory-mixed batches. The time taken to carry out each conventional test is considerable.

There are several other test methods including electron microscopy, microradiography and a method based on electrical resistance. Only the optical method has, at present, gained widespread acceptance and ASTM approval as a tentative method. The various techniques give different information and should be regarded as complementary rather than independent. Indeed there are various definitions of 'degree of dispersion' depending on the method of determination. For example, the optical method permits one to observe only those agglomerates of largest linear dimension greater than about 9 microns (the smallest carbon black particles are much smaller than that). Electrical resistance measurements, on the other hand, are sensitive to the dispersion of microscopic particles. Thus, there can be considerable electrical resistance changes even when there is no change in the number or size of undispersed agglomerates as monitored optically.

It is an object of the invention to provide a method for measuring the homogeneity of a dispersion of a filler substance in an elastomer composition which will use a larger and therefore more representative sample of the composition than the samples hitherto used. Another object is to reduce the time taken in carrying out the measurement.

Recent research has indicated that certain nuclear magnetic resonance (NMR) measurements are sensitive to the degree of dispersion of a filler substance, such as carbon black, in elastomer compositions. See O'Brien, Cashell, Wardell and McBrierty, Macromol. 9, 653 (1976) reprinted in Rubber Chem. and Technol. 50, 747 (1977). The degree of dispersion i.e. the homogeneity of the composition, has now been assessed both by NMR and by conventional optical methods for a range of compositions. The results indicate an NMR sensitivity which is at least comparable with the sensitivity of the microtome section method used by Cabot and others.

The invention therefore provides a method for measuring the homogeneity of a dispersion of a filler substance in an elastomer composition, which method comprises measuring, in an NMR pulse spectrometer, the intensity of the short component and the total intensity, of the proton free induction decay, of a sample of the dispersion under investigation, and deriving the ratio of the two values obtained, which test ratio is an empirical measure of the homogeneity of the dispersion under investigation.

The said test ratio can be designated $P_t$. In a preferred embodiment, a standard ratio $P_s$ is similarly derived using a sample from a standard dispersion of arbitrarily defined optimum homogeneity, and the ratio $P_t/P_s$ is derived, and is a measure of the homogeneity of the test dispersion on a linear scale (0–1) wherein the standard dispersion has the value 1.0.

Preferably the standard dispersion is prepared by intimately mixing a quantity of the dispersion under investigation, or of a substantially similar dispersion until the ratio $P_t$ thereof, determined as set out above has reached a maximum, i.e., is not appreciably increased when re-determined after further mixing.

Mixing of the standard is carried out, for preference, in a laboratory mixer on a charge of about 1000–3000 g. The mixer is preferably designed expressly for work with elastomer compositions, and a suitable mixer is an internal mixer, type GK2, marketed by Werner and Pfleiderer, of Stuttgart, Germany.

Preferably the sample size used in the NMR pulse spectrometer exceeds 0.5 g.

Preferably the elastomer composition is a rubber composition, comprising natural or synthetic rubber or a blend of both. Preferably the filler comprises carbon black.

In the terminology of Burgess, Scott and Hess, see Rubber Chem. and Technol. 44, 230 (1971), the predominant particle in carbon black is termed a 'unit.' In this terminology "particle" is replaced by the term "domain," which is a roughly spherical paracrystalline graphitic region with a rotational orientation. The term "unit" replaces the term "aggregate." The unit is the basic carbon black particle and is composed of a number of domains chemically bonded to each other. Its structure depends on the number of domains it contains and their configuration. It is believed that the test method of the invention measures the completeness of dispersion of filler units in elastomer compositions.

While there is no intention that the present description shall be bound to or limited by any theoretical explanation, it is thought that each unit of carbon black, on working free from contact with adjacent units, e.g., in micelles or other aggregations thereof, becomes surrounded by a layer of elastomer material about 1 nm thick bonded thereto in such fashion as to reduce its molecular mobility substantially. It is thought that the method of the present invention is sensitive to the proportion of thus bonded polymer in the composition. This proportion is obviously related to the degree of dispersion of the added particles, since dispersion results from breakup of agglomerates, which deploys corresponding increments of particle surface for attachment of polymer molecules.

The invention will be appreciated in greater detail from the following description of particular and preferred embodiments thereof, given by way of example only:

EXAMPLE 1

|  | Parts by Weight |
|---|---|
| (a) The following ingredients are prepared: | |
| Styrene Butadiene Rubber (Styrene contents 23.7% approx.) | 100 |
| High abrasive furnace carbon black (ASTM designation N - 330) | 30 |
| The total volume of rubber and carbon is about 2 liters | |
| Extender oil | 1.5 |
| Zinc oxide | 5 |
| Stearic acid | 1 |
| HBS (an accelerator of vulcanisation) | 2 |
| Sulphur | 1 |

(b) Standard Dispersions were prepared as follows:

The rubber was loaded into a cold (15° C. to 25° C.) internal mixer having a capacity of about 2 liters. It was followed by the carbon black. The mixer was full.

With the cooling water on and a rotor speed of 50 rpm mixing was performed until the composition reached a temperature of 165° C. The load was removed from the mixer.

The composition and the mixer were allowed to cool to a temperature of between 15° C. and 25° C.

The composition was replaced in the mixer and with the cooling water on and a rotor speed of 50 rpm remixing was performed until the composition again reached a temperature of 165° C. The load was then removed from the mixer and milled on a roll mill for 10 minutes, the band of rubber being manually cut every 30 seconds; the mill speed was 8 M/min and the nip 0.5 mm to 1.0 mm. Cooling water passed through the rollers.

The other ingredient in the composition (oil, zinc oxide, stearic acid, HBS and sulphur) were incorporated subsequently on the roll mill in that order with the nip opened to 1 cm. They were added steadily over a period of 5 minutes, the band being cut every 30 seconds. The composition was then roll milled for a further 3 minutes, the band being cut every 30 seconds. The composition was taken off the roll mill, the roll mill nip adjusted to 1 mm and the composition passed twice through the nip perpendicularly to the roller axis. A sample of the composition was tested by the NMR method (see below) without further treatment to give a value of $P_s$ for uncured composition. A small portion of the composition was further roll milled and again NMR tested, but without any increase in the value of $P_s$ already found. Approximately 20 grms of the composition was cured at a temperature at 160° C. for 9 minutes. A sample of the cured compound was tested by the NMR method to give a value of $P_s$ for cured composition. In addition, a sample of the cured compound was tested by the Cabot, or microtome section, method.

Test Dispersions:

Five test dispersions were made and were labelled A, B, C, D and E. Each was made from the same ingredients as the standard dispersion given under (b) above in approximately the same proportions, but variations in the preparative steps were included with the object of yielding, as between the test dispersions and the standard dispersion, and between one test dispersion and another, a range of values of the completeness of the dispersion of the carbon particles or units. Thus for example the order of addition of the ingredients was treated as variable. However the major variable was the mixing and milling procedure, in which the times were shortened and a step or steps omitted in an arbitrary manner. Such variations in procedure can be relied upon in practice to produce variations in the degree of dispersion.

A sample of each test dispersion without further treatment (i.e. in an uncured state) was tested by the NMR method (see below).

A further sample (about 20 g) of each test dispersion was cured at 160° C. for 9 minutes, and a cured sample thereof was tested by the NMR method likewise.

For general comparison purposes a second cured sample of each test dispersion was tested by the Cabot, or microtome section, method.

(d) NMR Test Method: preparation of samples.

Discs of diameter about 1 cm were punched from the composition. A cylinder of the same diameter and about 1.5 cm high was formed, if necessary by stacking several of the discs. The cylinder was held together, if necessary, by wrapping with PTFE tape, and was mounted coaxially on the end of a glass tube, again by means of PTFE tape. Thus the sample volume was about 1 ml in every case.

(e) NMR Test Procedure

A Bruker pulsed NMR spectrometer operating at a resonant frequency of 40 MHz provided the proton free induction decay signal. The spectrometer was equipped to control sample temperature to 20° C.±1° C. The duration of a 90° pulse and the recovery time were about 5 microseconds and 7 microseconds, respectively. The sample size was such that the free induction decay signal-to-noise ratio was greater than 5 to 1 during every test.

The intensity of the free induction decay signal was measured at times 14 microseconds and 44 microseconds after the start of the 90° pulse, and the ratio $P_t$ (or $P_s$) between them (actually a percentage) was evaluated and indicated by an associated microprocessor appropriately programmed in known manner. The time interval between 90° pulses was 1 second.

The ratio of $P_t$ for each test dispersion to $P_s$ for the corresponding (i.e. cured or uncured as appropriate) standard dispersion was calculated yielding a set of values between 0 and 1 for the homogeneity of the dispersion in question. The homogeneity of the standard dispersion is of course 1 by definition.

(f) Results:

| | | | Homogeneity | | |
|---|---|---|---|---|---|
| | | | NMR Method | | Cabot |
| Dispersion | Not Cured | Cured | Not Cured | Cured | Method Cured |
| Standard | 12.5($P_s$) | 12.6($P_s$) | 1.000 | 1.000 | 1.000 |
| A | 8.0($P_t$) | 11.4($P_t$) | 0.640 | 0.905 | 0.991 |
| B | 7.6($P_t$) | 9.1($P_t$) | 0.608 | 0.722 | 0.981 |
| C | 7.7($P_t$) | 10.9($P_t$) | 0.616 | 0.865 | 0.974 |
| D | 6.6($P_t$) | 10.5($P_t$) | 0.528 | 0.833 | 0.965 |
| E | 6.4($P_t$) | 9.8($P_t$) | 0.512 | 0.778 | 0.960 |

No special inferences are intended to be drawn from the results of the Cabot, or microtome section method, determinations. They have only a rough correspondence with the results of the method of the invention, as might be expected in consideration of the tentative theoretical explanation, given earlier above, of the NMR method. The procedure for obtaining the numerical values of the Cabot method tests is known, and will not be given herein.

In the case of each test dispersion A, B, C, D and E the value of $P_t$ is based on the averages of 64 observations of $S_{14}$ and $S_{44}$, the designations of the free induction decay signal intensity at 14 microseconds and 44 microseconds, respectively, after the start of the 90° pulse.

An unfilled sample of the rubber composition was also tested, and the result was used to provide a calibration constant in the programming instructions for the microprocessor, whereby P=0 for the unfilled rubber composition.

The standard deviation of the NMR results was found, on 100 tests, to be 1%.

EXAMPLE 2

Four separate batches of rubber composition were made up, and labelled A, B, C and D, using in each case the following set of ingredients, and a total batch weight of about 200 kg:

| | Parts by weight |
|---|---|
| Natural rubber | 50 |
| Styrene/butadiene rubber (Styrene content approx. 23.7%) | 50 |
| Carbon Black | 30 |
| Oil | 8 |
| Chemicals (peptizer, tackfier, anti- | |

| | Parts by weight |
|---|---|
| oxidant, antiozonant, zinc oxide, stearic acid, accelerator, sulphur) | 15 |

Each of the four batches was subjected to the following mixing and sampling procedure in the stages indicated, using a factory internal mixer of approximately 200 kg capacity.

Masterbatch stage

All the rubber was mixed with the peptizer, the zinc oxide, the stearic acid, 80% of the carbon black and 65% of the oil. The mix was removed from the mixer and stored for not less than 24 hours. Test samples were taken from batches A, B, C and D at this stage and were labelled 1A, 1B, 1C and 1D respectively.

Secondary stage

About 194 kg of the masterbatch stock was placed in the mixer, and mixed with the tackifier, the antioxidant, the antiozonant, the remaining 20% of the carbon black and the remaining 35% of the oil. The mix was removed from the mixer and stored for not less than 24 hours. Test samples were taken from batches A, B, C and D at this stage and were labelled 2A, 2B, 2C and 2D respectively.

Final stage

About 192 kg of the secondary stock was placed in the mixer, and mixed with the accelerator and the sulphur. Test samples were taken from batches A, B, C and D at this stage and were labelled 3A, 3B, 3C and 3D respectively.

Cured test samples

Approximately 20 g was removed from each of the final stage samples 3A, 3B, 3C and 3D, was cured at 160° C. for 16 minutes, and the cured portions were labelled 4A, 4B, 4C and 4D.

Thus in the labelling of all these samples it will be appreciated that the letter represents the particular batch, and the digit represents the stage sampled, except that 3 and 4 both represent the final stage, 3 being uncured and 4 cured. These 16 samples represent the test dispersions for this example. All were tested by the NMR method. Preparation of NMR samples and test procedure were identical with those of Example 1.

Preparation of standard dispersion

Approximately 2 kg of secondary stock from one of the above batches was loaded into a cold (15° to 25° C.) laboratory internal mixer having a capacity of about 2 liters.

With the cooling water on and a rotor speed of 50 rpm mixing was performed for three minutes.

The load was removed from the mixer and passed three times through a roll mill; the mill speed was 8 M/min and the nip was approximately 3 mm. The nip was opened to approximately 6 mm and the compound sheeted off. A sample of the composition was tested by the NMR method without further treatment, and labelled 'standard (not cured).' Further roll milling of a small portion of the load, followed by NMR testing, failed to increase the value of $P_s$ already obtained. The compound was stored at room temperature for 24 hours. The accelerator and sulphur were incorporated on the roll mill with the nip opened to 1 cm. They were added steadily over a period of five minutes, the band being cut every 30 seconds.

The nip was closed to 3 mm and the compound passed through three times. The nip was opened to approximately 6 mm and the compound was sheeted off.

Approximately 20 grams of the compound was cured at a temperature of 160° C. for 16 minutes.

A sample of the cured compound, labelled 'standard (cured),' was tested by the NMR method.

Results

The following table gives the output value of $P_s$ for the standards and $P_t$ for each test sample as given by the spectrometer-microprocessor assembly, as well as the corresponding value for the homogeneity calculated for each sample as $P_t/P_s$.

|  | P values | Homogeneity |
|---|---|---|
| Standard (not cured) | 7.3 ($P_s$) | 1.000* |
| Sample 1A | 4.9 ($P_t$) | 0.671 |
| Sample 1B | 4.4 ($P_t$) | 0.603 |
| Sample 1C | 4.3 ($P_t$) | 0.589 |
| Sample 1D | 4.4 ($P_t$) | 0.603 |
| Sample 2A | 6.0 ($P_t$) | 0.822 |
| Sample 2B | 5.2 ($P_t$) | 0.712 |
| Sample 2C | 5.3 ($P_t$) | 0.726 |
| Sample 2D | 5.7 ($P_t$) | 0.781 |
| Sample 3A | 6.0 ($P_t$) | 0.822 |
| Sample 3B | 5.8 ($P_t$) | 0.795 |
| Sample 3C | 5.9 ($P_t$) | 0.808 |
| Sample 3D | 6.0 ($P_t$) | 0.822 |
| Standard (cured) | 9.3 ($P_s$) | 1.000* |
| Sample 4A | 8.1 ($P_t$) | 0.871 |
| Sample 4B | 8.0 ($P_t$) | 0.860 |
| Sample 4C | 8.0 ($P_t$) | 0.860 |
| Sample 4D | 8.1 ($P_t$) | 0.871 |

*by definition

The invention is not limited by or to the details of the specific embodiments described, many of which can undergo wide variation without departing from the scope of the invention.

What is claimed is:

1. A method for measuring the homogeneity of a dispersion of a filler substance in an elastomer composition, which method comprises: measuring, in an NMR pulse spectrometer, the intensity of a short component and a total intensity, of the proton free induction decay, of a sample of the dispersion under investigation, and deriving the ratio of the short component intensity and the total intensity obtained, said ratio ($P_t$) representing an empirical measure of the homogeneity of the dispersion under investigation.

2. A method as claimed in claim 1, which comprises additionally carrying out the said measurements on a sample of a standard dispersion of a filler substance in an elastomer composition, said standard dispersion having arbitrarily defined optimum homogeneity, to derive a second or standard ratio ($P_s$), and deriving the ratio $P_t/P_s$ to represent the homogeneity of the dispersion under investigation on a linear scale wherein the standard dispersion has the value 1.0.

3. A method as claimed in claim 2, which comprises preparing the standard dispersion by intimately mixing a quantity of a dispersion selected from the group consisting of the dispersion under investigation and a substantially similar dispersion, until the ratio $P_t$ thereof, determined as set out in claim 1, has reached a maximum whereby said ratio is not appreciably increased when re-determined after further mixing, and whereby said ratio $P_t$ is redesignated $P_s$, the standard ratio.

4. A method as claimed in claim 1, wherein the sample size used in the NMR spectrometer exceeds 0.5 g.

5. A method as claimed in claim 1, wherein the sample size is such that the free induction decay signal-to-noise ratio is greater than 5 to 1.

6. A method as claimed in claim 1, wherein the elastomer composition is a rubber composition, comprising natural or synthetic rubber or a blend of both.

7. A method as claimed in claim 1, wherein the filler is carbon black.

* * * * *